US012628601B2

(12) United States Patent
Kim et al.

(10) Patent No.: US 12,628,601 B2
(45) Date of Patent: May 12, 2026

(54) FILTER STRUCTURE AND SUBSTRATE TREATING SYSTEM INCLUDING FILTER STRUCTURE

(71) Applicant: Samsung Electronics Co., Ltd., Suwon-si (KR)

(72) Inventors: Yunho Kim, Yongin-si (KR); Heechul Park, Hwaseong-si (KR); Hyunwoo Kim, Yongin-si (KR); Yigil Cho, Seongnam-si (KR); Jaeeun Song, Hwaseong-si (KR); Jinhyeok Jang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 740 days.

(21) Appl. No.: 18/080,206

(22) Filed: Dec. 13, 2022

(65) Prior Publication Data

US 2023/0238254 A1     Jul. 27, 2023

(30) Foreign Application Priority Data

Jan. 25, 2022     (KR) ........................ 10-2022-0010487

(51) Int. Cl.
H10P 72/00        (2026.01)
B01D 63/06        (2006.01)
(Continued)

(52) U.S. Cl.
CPC ........ H10P 72/0402 (2026.01); B01D 63/063 (2013.01); B01D 63/065 (2013.01);
(Continued)

(58) Field of Classification Search
CPC ........ H01L 21/67017; H01L 21/67057; B01D 63/063; B01D 63/065; B01D 63/067;
(Continued)

(56) References Cited

U.S. PATENT DOCUMENTS 5,552,046 A     9/1996   Johnston et al.
5,639,365 A  *  6/1997   McLoughlin ........ B01D 63/068
                                                210/321.74
(Continued)

FOREIGN PATENT DOCUMENTS

JP         H06142645 A      5/1994
JP         2008272753 A     11/2008
(Continued)

OTHER PUBLICATIONS

Alberto Tiraferri, et al. "Highly Hydrophilic Thin-Film Composite Forward Osmosis Membranes Functionalized with Surface-Tailored Nanoparticles", Applied Materials & Interfaces 2012, 4, 5044-5053.
(Continued)

*Primary Examiner* — Jeffrie R Lund
(74) *Attorney, Agent, or Firm* — Muir Patent Law, PLLC

(57)        ABSTRACT

A filter structure includes a housing having an inlet and an outlet; a first filter embedded in the housing and including a polymer membrane for filtering a first fluid flowing from the inlet into the housing; and a second filter embedded in the housing, filtering a second fluid filtered by the first filter, and including mesoporous silica nanoparticles (MSN).

20 Claims, 10 Drawing Sheets

(51) Int. Cl.

| | |
|---|---|
| *B01D 69/02* | (2006.01) |
| *B01D 69/04* | (2006.01) |
| *B01D 69/10* | (2006.01) |
| *B01D 69/14* | (2006.01) |
| *B01D 71/26* | (2006.01) |
| *B01D 71/56* | (2006.01) |

(52) U.S. Cl.
CPC .......... *B01D 63/067* (2013.01); *B01D 69/02* (2013.01); *B01D 69/04* (2013.01); *B01D 69/107* (2022.08); *B01D 69/147* (2013.01); *B01D 69/148* (2013.01); *B01D 71/261* (2022.08); *B01D 71/56* (2013.01); *B01D 2319/025* (2013.01); *B01D 2319/06* (2013.01); *B01D 2325/04* (2013.01); *B01D 2325/12* (2013.01)

(58) Field of Classification Search
CPC ...... B01D 69/02; B01D 69/04; B01D 69/107; B01D 69/147; B01D 69/148; B01D 71/261; B01D 71/56; B01D 2319/025; B01D 2319/06; B01D 2325/04; B01D 2325/12; B01D 2317/08; B01D 2323/20; B01D 67/0006; B01D 69/125; B01D 71/027; B01D 61/58; C02F 1/281; C02F 1/44; C02F 2103/346
See application file for complete search history.

(56) References Cited

U.S. PATENT DOCUMENTS

| | | | |
|---|---|---|---|
| 7,815,805 B2 | 10/2010 | Niermeyer et al. | |
| 7,960,180 B2 | 6/2011 | Chang et al. | |
| 8,197,687 B2 | 6/2012 | Krogue et al. | |
| 9,149,771 B2 | 10/2015 | Isomura et al. | |
| 11,839,839 B2 * | 12/2023 | Choi ................ | H01L 21/67075 |
| 2002/0139746 A1 * | 10/2002 | Koslow .............. | B01J 20/28004 |
| | | | 210/488 |
| 2004/0178135 A1 | 9/2004 | Beplate | |
| 2009/0294348 A1 | 12/2009 | Krogue et al. | |
| 2014/0202952 A1 | 7/2014 | Afzulpurkar et al. | |
| 2014/0367326 A1 | 12/2014 | Deng et al. | |
| 2015/0089909 A1 | 4/2015 | Burns et al. | |
| 2016/0059190 A1 | 3/2016 | Yoo et al. | |

| | | | |
|---|---|---|---|
| 2017/0204821 A1 | 7/2017 | Willems et al. | |
| 2020/0254398 A1 | 8/2020 | Hamzik et al. | |
| 2023/0238254 A1 * | 7/2023 | Kim ..................... | B01D 63/065 |
| | | | 156/345.18 |

FOREIGN PATENT DOCUMENTS

| | | |
|---|---|---|
| JP | 4242440 B2 | 3/2009 |
| KR | 101595185 B1 | 2/2016 |
| KR | 101709621 B1 | 3/2017 |
| RU | 2005131318 A | 5/2006 |

OTHER PUBLICATIONS

Antonio Martin, et al. "Effect of amine functionalization of SBA-15 used as filler on the morphology and permeation properties of polyethersulfone-doped ultrafiltration membranes", Journal of MembraneScience520(2016)8-18.

Ghanshyam L. Jadav. "SANS study to probe nanoparticle dispersion in nanocomposite membranes of aromatic polyamide and functionalized silica nanoparticles", Journal of Colloid and Interface Science 351 (2010) 304-314.

Jingling Yang, et al. "Diatom-Mimicking Ultrahigh-Flux Mesoporous Silica Thin Membrane with Straight-Through Channels for Selective Protein and Nanoparticle Separations", Chemistry of Materials 2019, 31, 1745-1751.

Jun Yin, et al. "Fabrication of a novel thin-film nanocomposite (TFN) membrane containing MCM-41 nanoparticles (NPs) for water purification", Journal of Membrane Science 423-424 (2012) 238-246.

Muhammad Salman, et al. "Recent advances in the application of silica nanostructures for highly improved water treatment: a review", Environmental Science and Pollution Research (2019) 26:21065-21084.

Sherif A. El-Safty, et al. "Mesoporous silica nanotubes hybrid membranes for functional nanofiltration", Nanotechnology 21 (2010) 375603 (13pp).

Shuai Liang, et al. "Highly Hydrophilic Polyvinylidene Fluoride (PVDF) Ultrafiltration Membranes via Postfabrication Grafting of Surface-Tailored Silica Nanoparticles", Applied Materials & Interfaces, 2013, 5, 6694-6703.

Yupu Liu, et al. "Mesoporous Silica Thin Membranes with Large Vertical Mesochannels for Nanosize-Based Separation", Advanced Materials 2017, 29, 1702274.

\* cited by examiner

320a

FILTER STRUCTURE AND SUBSTRATE TREATING SYSTEM INCLUDING FILTER STRUCTURE

CROSS-REFERENCE TO RELATED APPLICATION(S)

This application claims benefit of priority to Korean Patent Application No. 10-2022-0010487 filed on Jan. 25, 2022 in the Korean Intellectual Property Office, the disclosure of which is incorporated herein by reference in its entirety.

BACKGROUND

Example embodiments of the present disclosure relate to a filter structure and a substrate treating system including a filter structure.

Generally, semiconductor manufacturing facilities may include a fabrication process for forming an electrical circuit on a silicon wafer used as a semiconductor substrate. In the fabrication process, a plurality of unit processes such as deposition, photolithography, etching, and cleaning processes may be performed. As sizes of substrates have decreased, it may be necessary to strictly control contaminants included in chemical materials used in each unit process.

SUMMARY

An example embodiment of the present disclosure is to provide a filter structure which may effectively remove contaminants included in chemical materials injected into a semiconductor process chamber and may not impede a flow of chemical materials.

An example embodiment of the present disclosure is to provide a substrate treating system including a filter structure which may effectively remove contaminants.

According to an example embodiment of the present disclosure, a filter structure includes a housing having an inlet and an outlet; a first filter embedded in the housing and including a polymer membrane for filtering a first fluid flowing from the inlet into the housing; and a second filter embedded in the housing, filtering a second fluid filtered by the first filter, and including mesoporous silica nanoparticles (MSN).

According to an example embodiment of the present disclosure, a substrate treating system includes a process chamber performing a semiconductor process on a substrate; a supply source supplying fluid to the process chamber; and a filter structure disposed between the supply source 20 and the process chamber, wherein the filter structure includes a first filter primarily filtering a first fluid supplied from the supply source and including a polymer membrane; and a second filter secondarily filtering a second fluid filtered by the first filter and including mesoporous silica nanoparticles having a functional group on a surface thereof.

According to an example embodiment of the present disclosure, a filter structure includes a first filter filtering fluid and including a polymer membrane; and a second filter filtering fluid passing through the first filter, wherein the second filter includes mesoporous silica nanoparticles having a particle size of about 50 nm to about 500 nm and a pore size of about 5 nm to about 20 nm and including one or more of functional groups of a thiol group and an amine group on a surface thereof.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

A substrate treating system 1 will be described according to an example embodiment with reference to FIG. 1.

Figure 1:
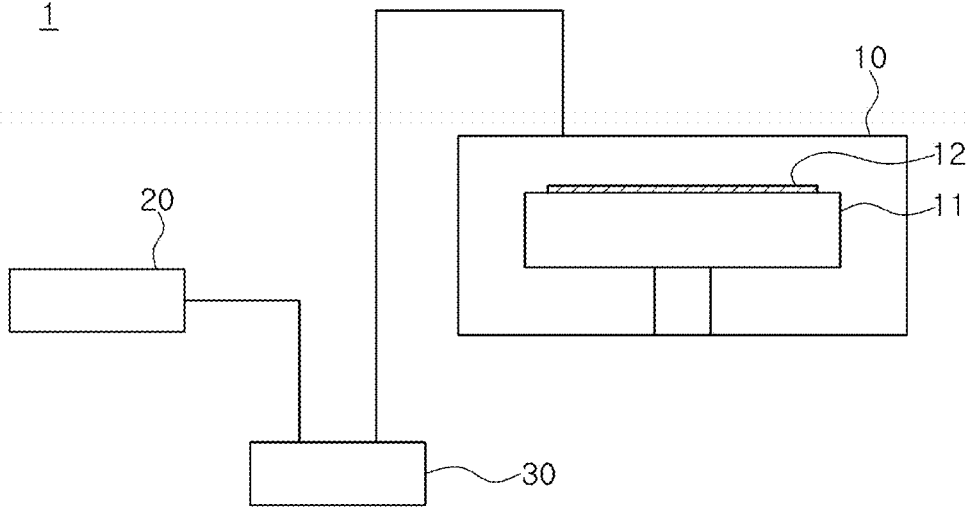
FIG. 1 is a diagram illustrating a substrate treating system according to an example embodiment of the present disclosure.

FIG. 1 is a diagram illustrating a substrate treating system 1 according to example embodiments. Only major components of the substrate treating system 1 are illustrated in FIG. 1 for ease of description.

Referring to FIG. 1, a substrate treating system 1 may include a process chamber 10, a supply source 20, and a filter structure 30.

A plurality of semiconductor processes may be performed on the substrate 12 in the process chamber 10. For example, a plurality of unit processes such as deposition, photolithography, etching, and cleaning processes may be performed in the process chamber 10. The process chamber 10 may include a substrate holder 11 therein. The substrate holder 11 may be configured to support the substrate 12 thereon.

The supply source 20 may supply chemical materials necessary for a semiconductor process into the process chamber 10. As an example embodiment, a photo process may be performed in the process chamber 10. The supply source 20 may supply a photoresist used for a photo process into the process chamber 10. As another example embodiment, a planarization process, such as, for example, a chemical-mechanical polishing (CMP) process may be performed in the process chamber 10. By the CMP process, unwanted foreign materials such as fine particles, metal impurities, organic materials, and the like, may be created on a surface of the film on the substrate 12. When such foreign materials remain on the substrate, the materials may cause defects in the semiconductor device. Accordingly, cleaning may be performed after the CMP. The supply source 20 may supply a cleaning solution required for the cleaning after the CMP. Fluid flowing into the process chamber 10 from the supply source 20 is not limited to a photoresist solution, a cleaning solution, and the like. The supply source 20 may provide various chemical materials necessary to perform the semiconductor process.

The filter structure 30 may filter chemical materials supplied from the supply source 20 and flowing into the process chamber 10. When contaminants included in the chemical materials provided from the supply source 20 flow into the process chamber 10, the contaminants may cause defects in the semiconductor device. The filter structure 30 may remove contaminants by filtering the fluid provided from the supply source 20, thereby providing chemical materials having relatively high purity to the process chamber 10. Accordingly, defects in the semiconductor device may be prevented.

The filter structure 30 will be described with reference to FIGS. 2A and 2B.

Figure 2A:
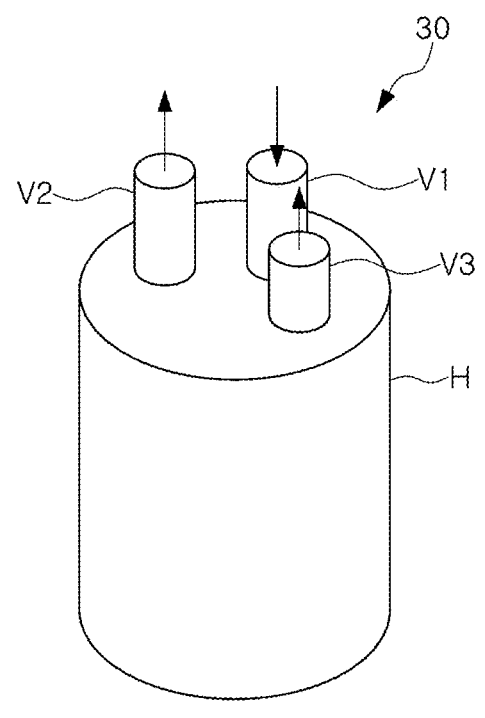
FIG. 2A is a perspective diagram illustrating a filter structure according to an example embodiment of the present disclosure.
Figure 2B:
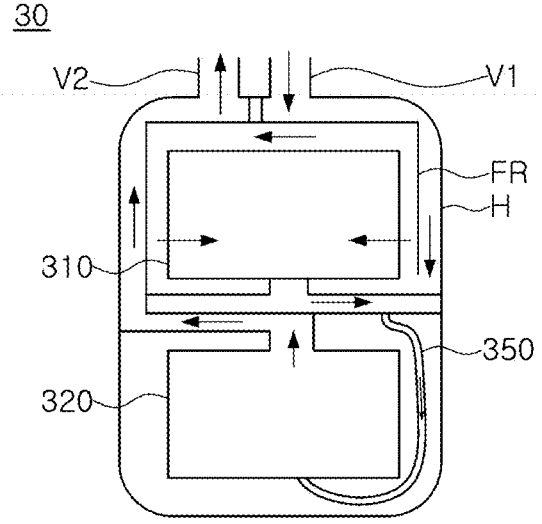
FIG. 2B is a cross-sectional diagram illustrating a filter structure according to an example embodiment of the present disclosure.

FIG. 2A is a perspective diagram illustrating an exterior of the filter structure 30, and FIG. 2B is a cross-sectional diagram illustrating the filter structure 30. The arrows illustrated in FIGS. 2A and 2B indicate a flow of the fluid.

Referring to FIGS. 2A and 2B, the filter structure 30 may include a housing H and first and second filters (310, 320) embedded in the housing H.

The housing H may include an inlet V1 and an outlet V2. The inlet V1 may be connected to a supply source 20 (in FIG. 1) and may allow fluid provided from the supply source 20 (in FIG. 1) to flow into the filter structure 30. The fluid flowing from the inlet V1 may pass through the first filter 310 and the second filter 320 and may be filtered, and may flow out from the filter structure 30 through the outlet V2. The chemical materials discharged through the outlet V2 may flow into the process chamber 10 (in FIG. 1). The inlet V1 and the outlet V2 may be spaced apart from each other and may not be connected to each other.

The housing H may further include a vent V3 for removing gas included therein. The vent V3 may be configured to remove gas included in chemical materials. When it is not necessary to remove the gas from the chemical materials, the vent V3 may be closed by a valve included in the vent V3. In example embodiments, the vent V3 may not be provided.

The inlet V1, the outlet V2 and the vent V3 may be disposed on the upper surface of the housing H, but an example embodiment thereof is not limited thereto. For example, the inlet V1 and the outlet V2 may be disposed in opposite positions on the side surface of the housing H, and the vent V3 may be disposed on the upper surface of the housing.

The first filter 310 and the second filter 320 may remove impurities included in the chemical materials by filtering the chemical materials. The first filter 310 and the second filter 320 may be connected to each other in series. The first filter 310 may filter the fluid flowing in from the inlet V1, and the second filter 320 may filter the fluid filtered by the first filter 310. The fluid filtered by the second filter 320 may flow out through the outlet V2.

The first filter 310 may include a polymer film. The polymer film may include pores to remove unspecified contaminants having a size larger than the pore size. The polymer film may include, for example, ultra-high-molecular-weight polyethylene (UPE), high-density polyethylene (HDPE), polytetrafluoroethylene (PTFE), nylon (Nylon), or the like, or a combination thereof.

The second filter 320 may filter the fluid filtered by the first filter 310. The second filter 320 may be connected to the first filter 310 in series and may be disposed below the first filter 310 in the flow direction of the fluid. The second filter 320 will be described in greater detail later with reference to FIGS. 3A to 3C.

The filter structure 30 may further include a connection pipe 350 for allowing the fluid filtered by the first filter 310 to flow into the second filter 320. However, in example embodiments, the connection pipe 350 may not be provided, and the fluid may move along a path in the housing H (see FIG. 5).

The housing H may further include an inner frame (FR) for determining the flow direction of the fluid. The inner frame FR may form a flow path through which the fluid flows into the connection pipe 350 after the fluid flowing in the inlet V1 passes through and is filtered by the first filter 310. The inner frame FR may form a flow path through which the fluid filtered through the second filter 320 flows out through the outlet V2. Also, the inner frame FR may separate the inlet V1 from the outlet V2 and may separate the fluid flowing in from the inlet V1 from the fluid flowing out through the outlet V2. However, the shape of the inner frame FR and the flow path of the fluid according thereto are not limited to the examples illustrated in FIGS. 2A and 2B. In other example embodiments, the inlet V1 and the first filter 310 may be directly connected to each other. After the fluid flowing from the inlet V1 passes through the upper surface of the first filter 310, the fluid may flow out from the side surface and may flow into the second filter 230. Even in this case, the fluid flowing into the inlet V1 and the fluid flowing out from the outlet V2 may be separated from each other by the inner frame FR.

Next, the second filter 320 will be described with reference to FIGS. 3A to 3C.

Figure 3A:
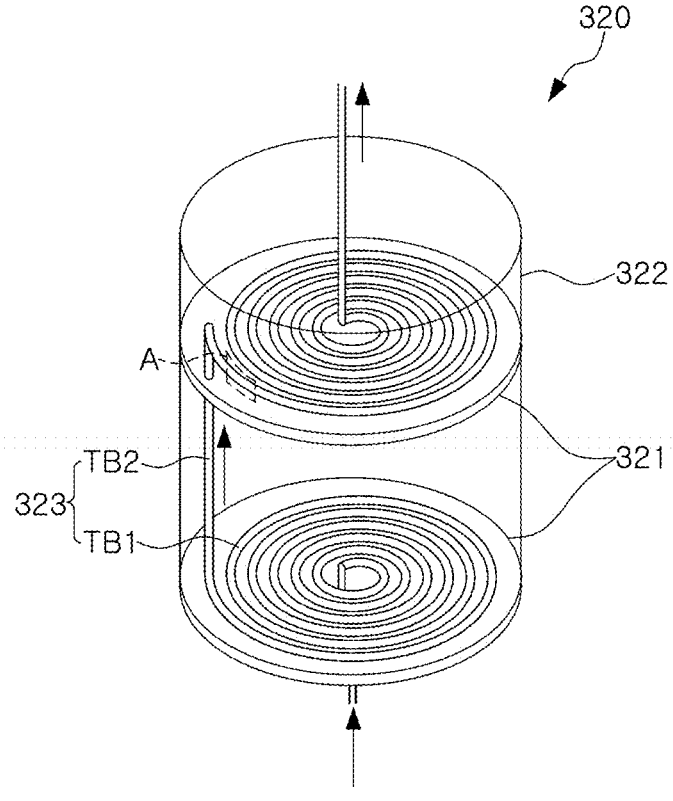
FIG. 3A is a perspective diagram illustrating a filter according to an example embodiment of the present disclosure.
Figure 3B:
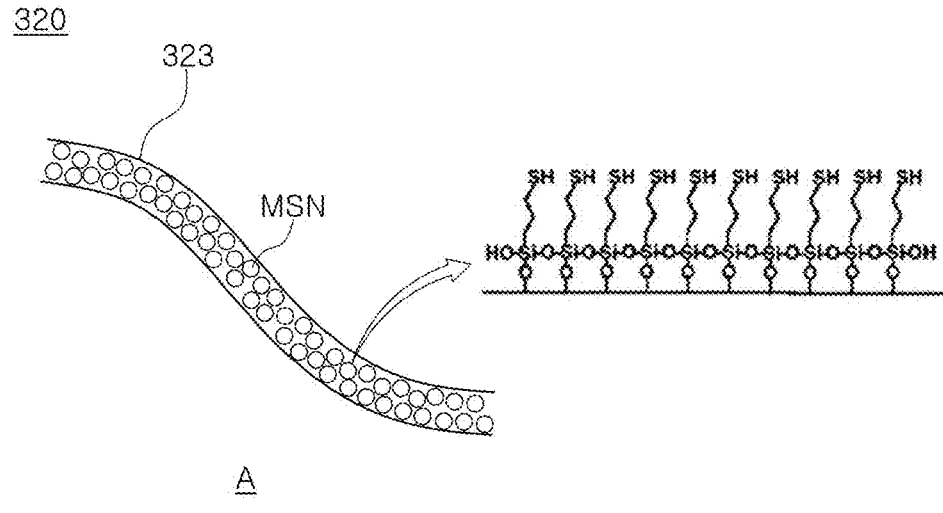
FIGS. 3B and 3C are enlarged diagrams illustrating a portion of a filter according to an example embodiment of the present disclosure.
Figure 3C:
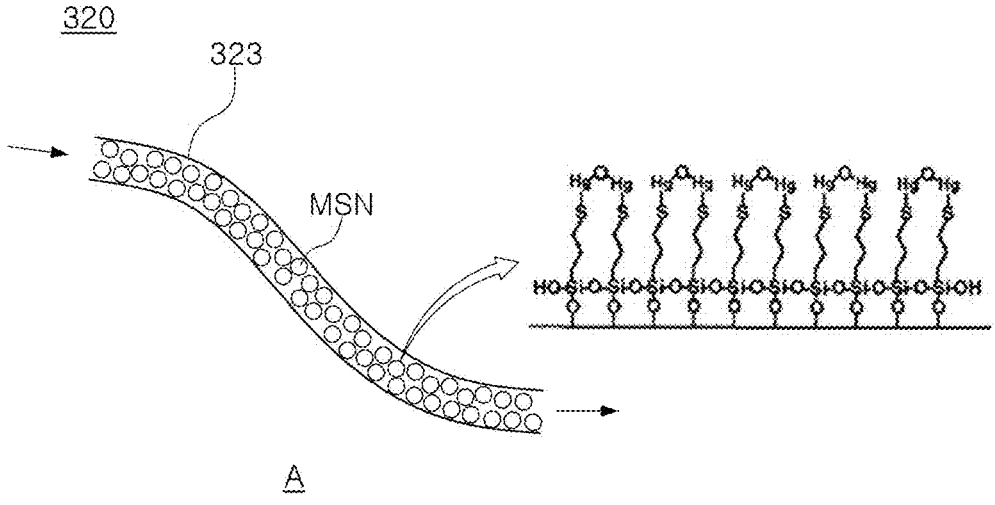

FIG. 3A is a perspective diagram illustrating the second filter 320, and FIGS. 3B and 3C are enlarged diagrams illustrating a portion of the second filter 320. FIG. 3B illustrates the second filter 320 before filtering the fluid, and FIG. 3C illustrates the second filter 320 after filtering the fluid. The arrows illustrated in FIGS. 3A and 3C indicate the flow of the fluid.

Referring to FIGS. 3A to 3C, the second filter 320 may include a separator 321 and a tube structure 323 disposed on the separator 321. The second filter 320 may further include a case 322 protecting the separator 321 and the tube structure 323.

The tube structure 323 may be connected to the connection pipe 350 (in FIG. 2b) and may receive the fluid filtered by the first filter 310 (in FIG. 2b). The tube structure 323 may have a multilayer structure having a spiral shape. The tube structure 323 may include a first portion TB1 having a spiral shape disposed on the separator 321 and a second portion TB2 extending in a direction perpendicular to the separator 321. The first portion TB1 may have a spiral shape such that a movement length of the fluid passing through the tube structure 323 may increase. The second portion TB2 may penetrate at least a portion of the separator 321. The second portion TB2 may allow fluid to move between the adjacent first portions TB1. The first portion TB1 and the second portion TB2 may be integrated with each other. The fluid passing through 310 (in FIG. 2B) may pass through the tube structure 323 of the second filter 320 and may be secondarily filtered.

The diameter, the length, and the like, of the tube structure 323 of the second filter 320 may be determined in consideration of the flow of the fluid. For example, the diameter of the tube structure 323 may be determined in consideration of the flow rate of the fluid. The length of the tube structure 323 may be determined in consideration of the flow length of the fluid. The shape of the tube structure 323 may vary according to a concentration and the type of contaminants included in the fluid. The diameter of the tube structure 323 may be configured to be, for example, from a few micrometers to a millimeter.

The number of the first portion TB1, the shape of the first portion TB1, the length of the second portion TB2, and the like, are not limited to the examples illustrated in FIG. 3A. For example, the number of the first portion TB1 may be three or more, and to increase packing density of the tube structure 323, the length of the second portion TB2 may be shortened.

The tube structure 323 may be filled with mesoporous silica nanoparticles (hereinafter "MSN"). Since the MSN has a porous structure, a relatively large surface area per unit weight may be secured. The fluid passing through the tube structure may pass through the pores of the MSN. Though MSN is referred to throughout, other nanoparticles such as mesoporous nanoparticles e.g. mesoporous alumina, aluminasilicate, iron oxide, zinc oxide, titanium oxide, zirconium oxide, etc or combinations thereof could also be used depending on how the surface is functionalized, the process fluid being filtered, contaminants to be removed etc. However, details below are in relation to MSN or other type of silica substrates or particles.

In example embodiments, the MSN may include one or more functional groups on the surface thereof. The functional groups formed on the surface of the MSN may remove contaminants by adsorption. Each functional group formed on the MSN surface may remove specific contaminants by adsorbing the contaminants as a target. For example, the MSN may include functional groups removing contaminants such as metals, organic molecules, chemical dyes, and oils.

In example embodiments, the MSN may include a functional group such as a thiol group, an amine group, an aldehyde group, a carboxyl group, a hydroxyl group, and the like, on the surface thereof. As the MSN having a functional group formed on the surface thereof, for example, salicylaldehyde-functionalized SBA-15 mesoporous silica (SA-SBA-15), SH-SBA-16 mesoporous silica, amino-functionalized mesoporous silica (NH2-MCM-41), 1-furoyl thiourea on mesoporous silica (FTU-functionalized SBA-15), melamine-based dendrimer amines-functionalized SBA-15 mesoporous silica (MDA-SBA-15), and the like, may be used. The above-described MSN may remove the contaminants such as metals, organic molecules, chemical dyes, and oils by functional groups adsorbing the contaminants, the functional groups formed on the surface thereof. However, the functional group formed on the MSN surface is not limited to the aforementioned example, and may vary depending on the type of contaminants to be removed. The second filter

320 may include MSN having one or more functional groups on the surface thereof depending on the type of contaminant to be removed.

The type of MSN filled in the second filter 320 is not limited to any particular example. For example, as the MSN filled in the second filter 320, a spherical MSN, MCM-41, MCM-48, MCM-50, SBA-15, SBA-16, or the like may be used.

FIGS. 3B and 3C illustrate the second filter 320 including MSN having a thiol group (—SH) formed on the surface thereof according to an example. FIG. 3B illustrates the second filter 320 before the fluid is filtered, and FIG. 3C illustrates the second filter 320 after the fluid is filtered. 3B and 3C are enlarged diagrams illustrating portion A in FIG. 3A.

As illustrated in FIG. 3B, the MSN of the second filter 320 may include a thiol group on the surface thereof. When the fluid including contaminants passes through the second filter 320 filled with MSN including thiol groups, the contaminants included in the fluid may be removed by being adsorbed by the thiol groups. Since the thiol group has relatively high affinity with metal materials, the thiol group may effectively remove contaminants such as metals included in the fluid. For example, as illustrated in FIG. 3C, when the fluid includes mercury oxide ($Hg_2O$) as a contaminant, mercury atoms connected by oxygen atoms may be removed by bonding to adjacent thiol groups.

MSN is illustrated in a spherical shape in FIGS. 3B and 3C, but MSN may have a porous structure including pores. As the MSN filled in the second filter 320, MCM-41, MCM-48, MCM-50, SBA-15, SBA-16, and the like, may be used, and the MSN is not limited to the spherical shape.

A size of the pores of the MSN filled in the second filter 320 may be about 5 nm or more and about 20 nm or less. When the size of the pores of the MSN is less than about 5 nm, a flow rate of the fluid passing through the second filter 320 may be lowered. When the size of the pores of the MSN is more than about 20 nm, the surface area of the MSN may not be sufficient.

A size of the particle of the MSN filled in the second filter 320 may be about 50 nm or more and about 500 nm or less. As the particle size of MSN satisfies the above range, MSN may have the above-described pore size.

The surface area of the MSN filled in the second filter 320 may be about 500 $m^2$/g or more and 1,400 $m^2$/g or less. As the surface area of the MSN satisfies the above range, contaminants included in the fluid may be effectively removed while ensuring the flow rate of the fluid.

Referring to FIGS. 2A and 2B together, the filter structure 30 according to example embodiments may include a first filter 310 and a second filter 320 connected to each other in series, such that chemical materials required for the process of manufacturing the semiconductor device may be provided.

When the filter structure only includes a filter including a polymer membrane, by reducing the size of pores of the polymer membrane, micro-contaminants may be removed. However, as the size of the pores decreases, the flow rate of the fluid passing through the polymer membrane may decrease, and accordingly, there may be a limitation in reducing the size of the pores. Alternatively, contaminants may be removed by polarizing the polymer film. However, only ionic impurities may be removed using the polarized polymer membrane, and it may be difficult to remove oils, organic molecules, and the like.

The filter structure 30 in example embodiments may primarily filter the fluid in the first filter 310, and may secondarily filter the fluid passing through the first filter 310 in the second filter 320. The first filter 310 may remove unspecified contaminants having a size larger than the pore size of the polymer film. The first filter 310 may remove contaminants by sieving. Contaminants not removed by the first filter 310 may be removed by being absorbed to a functional group formed on the surface of the MSN of the second filter 320.

Since the filter structure 30 uses both a sieving removal method and an adsorption removal method, various types of contaminants may be efficiently removed. Also, the filter structure 30 may secure a relatively large pore size of the filter as compared to a filter structure using only a filtering method. Accordingly, the flow rate of the fluid passing through the filter structure 30 may not decrease.

Figure 4:
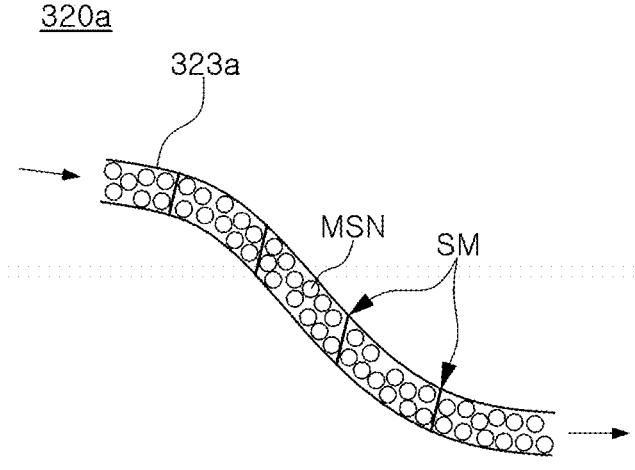
FIG. 4 is an enlarged diagram illustrating a portion of a filter according to an example embodiment of the present disclosure.

FIG. 4 illustrates a second filter 320a according to example embodiments. The second filter 320a in FIG. 4 may be different from the second filter 320 in FIGS. 3A and 3B in that the second filter 320a may further include the separation structure SM in the filter structure 323a.

The separation structure SM illustrated in FIG. 4 may be configured to prevent the movement of the MSN. When the movement of the fluid in one direction within the tube structure 323a continues, the MSN may move in the flow direction. Accordingly, MSNs may be concentrated downstream in the flow direction, such that distribution may not be uniform.

The separation structure SM disposed in the tube structure 323a may prevent the movement of the MSN described above. In an example embodiment, the separation structure SM may be configured to have pores having a size smaller than a particle size of the MSN. For example, the separation structure SM may be configured as a syringe filter, a membrane, or the like.

In FIG. 4, the separation structures SM may be uniformly distributed in the tube structure 323a, but the number of the separation structures SM and the positions of the separation structures SM are not limited to the illustrated examples. The number of the separation structures SM and the positions of the separation structures SM may vary in consideration of a flow velocity of a fluid, a diameter, and a length of the tube structure 323a. In other example embodiments, the second filter 320a may include the separation structures SM only on both ends of the tube structure 323a and may prevent the MSN from flowing out of the tube structure 323a.

A filter structure 30' and a second filter 320b will be described according to example embodiments with reference to FIGS. 5, 6A, and 6B.

Figure 5:
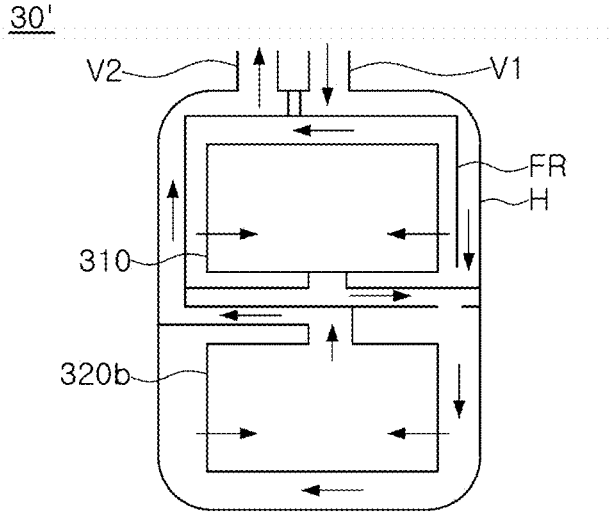
FIG. 5 is a cross-sectional diagram illustrating a filter structure according to an example embodiment of the present disclosure.
Figure 6A:
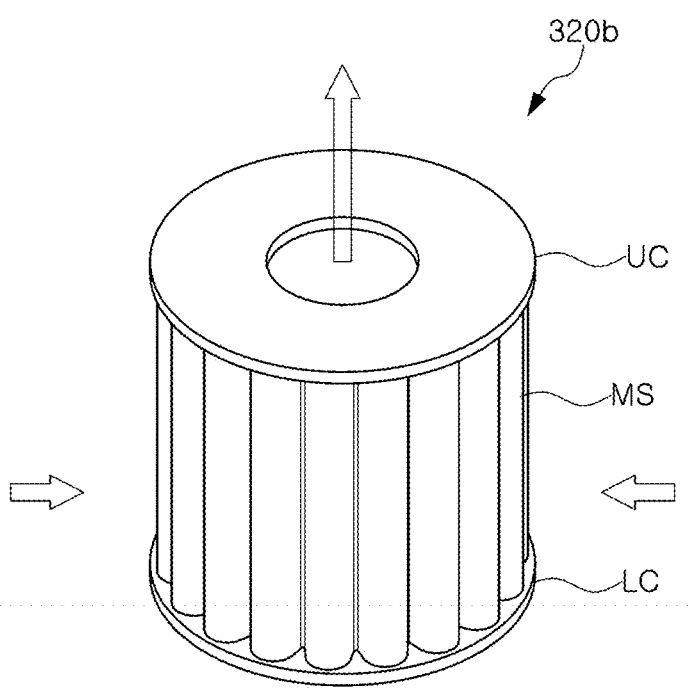
FIG. 6A is a perspective diagram illustrating a filter structure according to an example embodiment of the present disclosure.
Figure 6B:
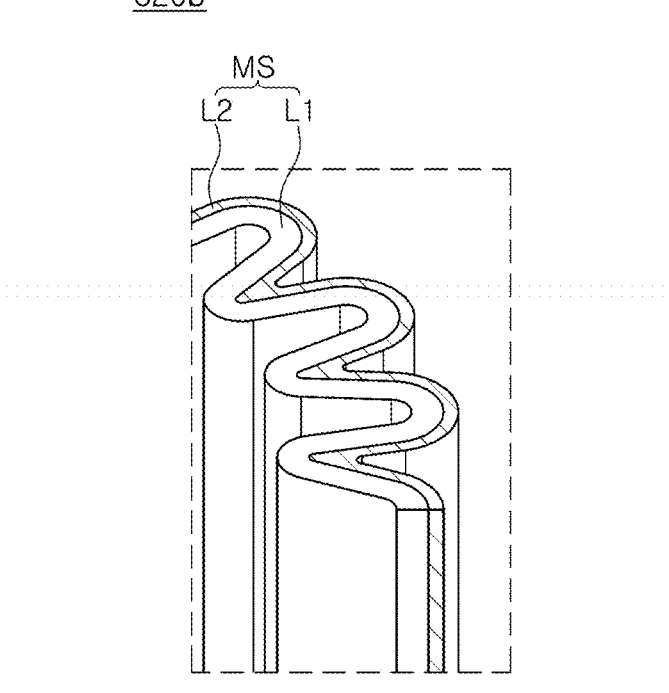
FIG. 6B is an enlarged diagram illustrating a portion of a filter according to an example embodiment of the present disclosure.

FIG. 5 illustrates a filter structure 30' according to example embodiments. 6A illustrates a second filter 320b according to example embodiments, and FIG. 6B illustrates an enlarged diagram illustrating a portion of a stack structure MS of the second filter 320b according to example embodiments.

In the example embodiment in FIGS. 5 to 6A, the component may have the same reference numerals as in FIGS. 2A to 3C but may have different alphabets, which may be to describe an example embodiment different from those of FIGS. 2A to 3C. The descriptions of the components having the same reference numbers may be the same or similar.

Referring to FIG. 5, the filter structure 30' may be different from the filter structure 30 illustrated in FIGS. 2A and 2B in that the filter structure 30' may not include a connector 350. The fluid filtered by the first filter 310 may flow into the second filter 320b disposed below the first filter 310 along the flow path of the housing H by the inner frame FR.

As illustrated in FIGS. 6A and 6B, the second filter 320b may have a cylindrical structure. The second filter 320b may include an upper structure UC, a lower structure LC, and a stack structure MS provided between the upper structure UC and the lower structure LC. The fluid may flow into the side surface of the second filter 320b along the arrow illustrated in FIG. 6A, may be filtered, and may be discharged upwardly. Although not illustrated in FIG. 6A, a side structure for protecting the stack structure MS may be further included between the upper structure UC and the lower structure LC. The side structure may have a structure including pores for the inflow of fluid.

The second filter 320b may have a serpentine folded structure. As the second filter 320b has such a structure, a contact area between the fluid and the second filter 320b may increase. However, the shape of the second filter 320b is not limited thereto. In example embodiments, the second filter 320b may have a planar shape, a zigzag shape, or the like.

The second filter 320b may have a stack structure in which two or more layers are stacked. In an example embodiment, the second filter 320b may include a first layer L1 and a second layer L2. The fluid may be filtered while sequentially passing through the second layer L2 and the first layer L1.

The first layer L1 may be a porous support. The first layer L1 may support the second layer L2 disposed on the first layer L1. Since the first layer L1 has a porous structure, the fluid may allow the fluid to pass therethrough without impeding the flow of the fluid. The first layer L1 may be configured as, for example, a polymer layer. In an example embodiment, the first layer L1 may include polysulfone.

The second layer L2 may be disposed on the first layer L1. The second layer L2 may allow the fluid filtered by the first filter 310 to flow thereinto and may allow the fluid to flow to the first layer L1. The second layer L2 may be configured as a thin film including MSN. In an example embodiment, the second layer L2 may be configured as a polyamide layer including MSN. The thickness of the second layer L2 may be thinner than the thickness of the first layer L1. In example embodiments, the thickness of the second layer L2 may be equal to or greater than about 200 nm and equal to or less than about 500 nm.

MSN included in the second layer L2 may be about 50 wt % or more and about 80 wt % or less with respect to the total weight of the second layer L2. When the content of MSN is less than about 50 wt %, the effect of removing impurities by MSN may not be sufficient. When the MSN content is about 80 wt % or less, flexibility of the second layer L2 may be secured. By securing flexibility of the second layer L2, the stack structure MS may form a serpentine shape as illustrated in FIGS. 6A and 6B.

The size of pores of the MSN included in the second layer L2 may be about 10 nm or more and about 20 nm or less. When the pore size is less than about 10 nm, the flow rate of the fluid may decrease. When the pore size exceeds about 20 nm, the surface area of the MSN may not be sufficiently secured.

The particle size of the MSN included in the second layer L2 may be equal to or greater than about 50 nm and equal to or less than about 200 nm. As the particle size satisfies the above range, the above-described pore size may be secured.

The second filter 320b may include the second layer L2 including MSN, thereby improving efficiency of removing contaminants in the fluid, and improving the flow rate of the fluid.

For example, the second filter 320b may have a flow rate of about 6 or more times faster than that of a filter including only the first layer L1 of the porous support. Also, in the case of a filter including the second layer L2 of polyamide in which MSN is not integrated on the first layer L1 of the porous support, due to properties of the fine pore of polyamide, the range of size of removable contaminants may be widened, whereas the flow rate may be lowered, such that contaminants may not be smoothly removed.

The second filter 320b in example embodiments may include the second layer L2 in which MSN is integrated, thereby increasing the efficiency of removing contaminants and increasing the flow rate of the fluid.

Figure 7:
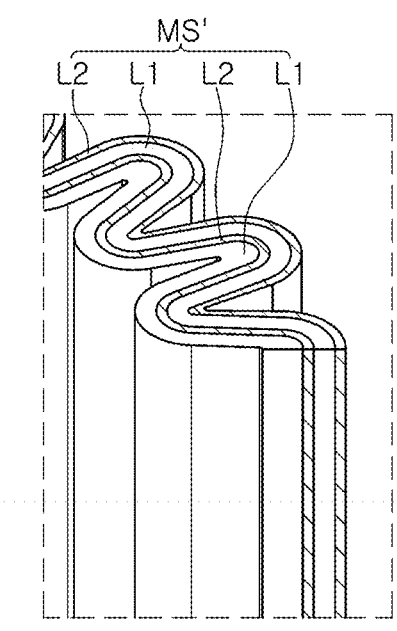
FIG. 7 is an enlarged diagram illustrating a portion of a filter according to an example embodiment of the present disclosure.

FIG. 7 illustrates an enlarged diagram illustrating a portion of the second filter 320c according to example embodiments. FIG. 7 illustrates a portion corresponding to FIG. 6.

The second filter 320c in FIG. 7 may be different from the second filter 320b in FIG. 6 in terms of the structure of the stack structure MS'. In the stack structure MS' of the second filter 320c, the first layer L1 and the second layer L2 may be alternately stacked. The second filter 320c may include a plurality of first layers L1 and a plurality of second layers L2. The first layer L1 may be configured as a porous support, and the second layer L2 may be configured as a thin film including MSN. Since the second filter 320c may include the plurality of second layers L2, the number of times the fluid is filtered may increase.

FIG. 7 illustrates the example embodiment in which two first layers L1 and two second layers L2 are provided, but an example embodiment thereof is not limited thereto. In example embodiments, the second filter 320c may include three or more first layers L1 and three or more second layers L2. In other example embodiments, the number of the first layer L1 may be different from the number of the second layer L2. For example, the second filter 320c may include a single first layer L1 and second layers L2 disposed on both surfaces of the first layer L1.

Figure 8:
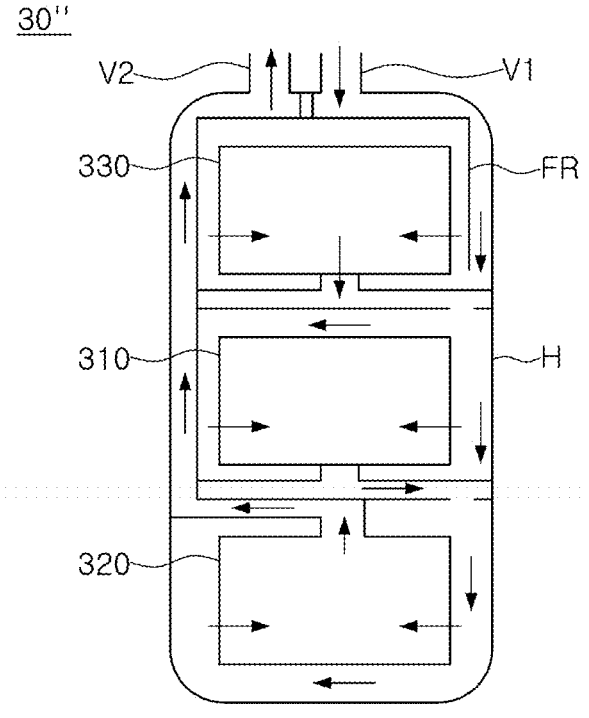
FIG. 8 is a cross-sectional diagram illustrating a filter structure according to an example embodiment of the present disclosure.

FIG. 8 illustrates a filter structure 30" according to example embodiments.

The filter structure 30" illustrated in FIG. 8 may be different from the filter structure 30 in FIGS. 2A and 2B and the filter structure 30' in FIG. 5 in that the filter structure 30" may further include the third filter 330.

In example embodiments, the third filter 330 included in the filter structure 30" may be disposed in series with the first filter 310 on the first filter 310. The fluid flowing in through the inlet V1 may pass through the third filter 330, the first filter 310, and the second filter 320 in sequence, and may be flow out through the outlet V2.

In example embodiments, the third filter 330 may include MSN having a functional group on the surface thereof. The third filter 330 may have the structure the same as or similar to those of the second filters (320 in FIG. 3A, 320a in FIG. 4, 320b in FIGS. 6A and 6B, and 320c in FIG. 7) described in the aforementioned example embodiment.

The functional group formed on the MSN surface of the second filter 320 may be the same as or different from the functional group formed on the MSN surface of the third filter 330. In example embodiments, by forming different types of functional groups in the MSN of the second filter 320 and the MSN of the third filter 330, the second filter 320 and the third filter 330 may remove different types of contaminants. In example embodiments, the second filter 320 may include an amine group, and the third filter 330 may include a thiol group.

The second filter 320 and the third filter 330 may be the same structure or different structures. In example embodiments, both the second filter 320 and the third filter 330 may have a layered structure including a thin film in which MSN is integrated. In other example embodiments, the second filter 320 may have a tube structure filled with MSN, and the third filter 330 may have a thin film structure.

In the example embodiment illustrated in FIG. 8, the filter structure 30" may include three filters, but an example embodiment thereof is not limited thereto. In example embodiments, the filter structure may include a plurality of polymer membrane filters and a filter including MSN.

Figure 9A:
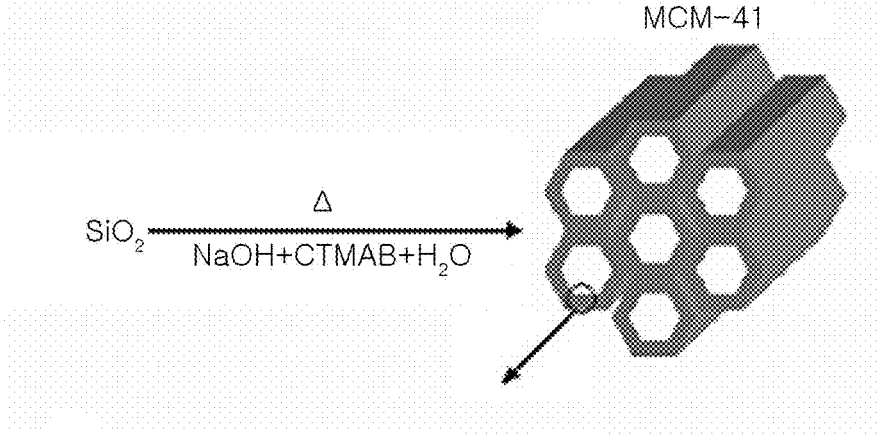
FIGS. 9A and 9B are diagrams illustrating a method of manufacturing mesoporous silica nanoparticles according to an example embodiment of the present disclosure.
Figure 9B:
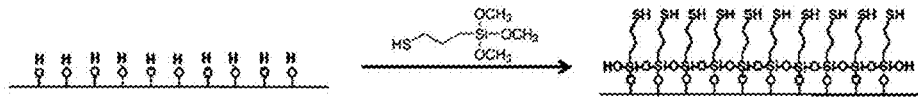
Figure 10:
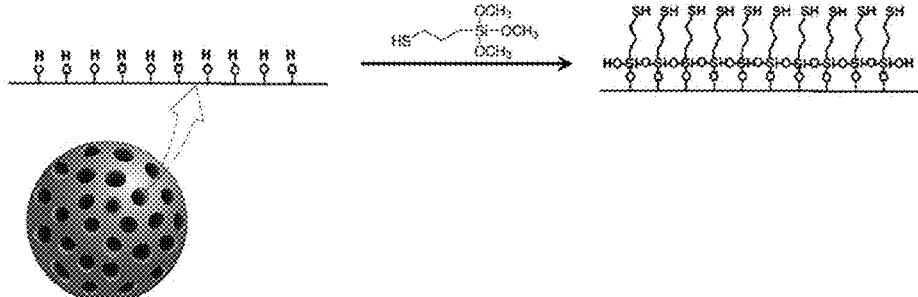
FIG. 10 is a diagram illustrating a method of manufacturing mesoporous silica nanoparticles.

FIGS. 9A, 9B, and 10 are diagrams illustrating a method of manufacturing and functionalizing an MSN according to example embodiments. In the examples below, a self assembled monolayer (SAM) is provided on the surface of the MSN. The SAM has a head (anchor) group bound to the surface of the MSN, which can be a silane head group in the precursor compounds (though this can also be a different head group depending on the surface material). The silane precursor compounds for the SAM are disclosed below as being methoxysilanes, however other alkylsilanes such as other alkoxysilanes can be used as precursors (such as ethoxysilanes, propoxysilanes, etc) as well as halosilanes (chlorosilanes, bromosilanes etc). As an example instead of the trimethoxysilane examples below, triethoxysilanes or trichlorosilanes could be used. Also, mono-, di- and tri-alkoxysilanes and combinations thereof, and mono-, di- and tri-chlorosilanes and combinations thereof may be used. Also, the body (spacer group) of the SAM in the examples below is a propyl group, the body can be an alkyl group with any suitable number of carbons (e.g. from 4 to 18 carbons). And, instead of the thiol and amine functional (terminal) groups disclosed below, other functional groups such as carboxyl, aldehyde, hydroxyl etc can be used. Also head groups other than silane (e.g. thiol head groups for metal particles, or phosphonic, sulfonic, silanol or other silyl groups for oxide particles, can be used. Other organosilane starting materials that form monolayers are also possible.

FIG. 9A illustrates a method of manufacturing MCM-41 as an example of MSN. FIG. 9B illustrates a method of forming a self assembled monolayer on the surface of MCM-41, which monolayer has an amine terminal functional group ($-NH_2$).

FIG. 10 illustrates a method of forming a self assembled monolayer on the surface of a spherical MSN, which monolayer has a terminal functional thiol group ($-SH$). As can be seen in these figures, methoxysilane precursors are provided which undergo hydrolysis (e.g. replacement of the methoxy groups with $-OH$), followed by a condensation reaction with bonding to the surface of the MSN via the surface hydroxyl groups, as well as bonding between adjacent silanol molecules, (along with the release of $H_2O$) so as to form a monolayer with a "2D" siloxane matrix along the surface of the MSN as illustrated, and along with the alkyl bodies and reactive end functional groups extending from this siloxane matrix in a tightly packed and highly cross-linked monolayer assembly.

Referring to FIG. 9A, MCM-41 may be prepared by hydrothermal crystallization. In example embodiments, about 0.03 mol of fumed silica ($SiO2$) may be added to about 0.6 M of sodium hydroxide ($NaOH$) aqueous solution, thereby forming a mixture. The mixture may be stirred at a temperature of about 80° C. for about 3 hours. With constant stirring of the mixture, about 0.015 mol of CTMAB ($C_{19}H_{42}BrN$) may be added. After stirring the mixture for about 1 hour, 0.0102 mol of 37% hydrochloric acid (HCl) may be added to the mixture dropwise, and about 27 ml of deionized water may be added. The mixture may be stirred at room temperature for about 2 hours, may be transferred to a Teflon bottle, and may be allowed to crystallize at about 100° C. for 3 days. A molar ratio of the mixture may be $SiO_2$:NaOH:CTMAB:HCl:$H_2O$=1:0.54:0.50:0.34:100. MSN (MCM-41) prepared by the above-described method may have a structure including regularly arranged cylindrical mesopores. MCM-41 may include a hydroxyl group on the surface thereof.

Referring to FIG. 9B, 3-aminopropyltrimethoxysilane may be added to MCM-41, thereby forming a thiol group on the surface of MCM-41. In example embodiments, 2.5 g of MCM-41 may be refluxed in about 50 ml of n-hexane including 2.5 g of 3-aminopropyltrimethoxysilane. Accordingly, MCM-41($NH_2$-MCM-41) having an amine group formed on the surface thereof may be formed.

FIG. 10 illustrates a method of forming a thiol group on the surface of MSN. In example embodiments, 3.5 g of spherical MSN may be suspended in 100 ml of reverse osmosis water (RO water) and may be refluxed for 3 hours. The suspension may be refluxed with about 20 ml of 3-mercaptopropyltrimethoxysilane. Accordingly, MSN on a surface of which a thiol group is formed may be formed. As illustrated in FIG. 10, a spherical MSN may be used as the MSN. The hydroxyl group of the surface the spherical MSN may be substituted with a functional group having a thiol group by the method described above.

However, the method of manufacturing MSN having a functional group formed on the surface thereof is not limited to the example illustrated in FIGS. 9A, 9B and 10, and other methods may be used depending on the type of the functional group. In the above-described preparation method, the weight, volume, and the like, of the compound may be merely examples, and may vary in example embodiments.

The second filters 320, 320a, 320b, and 320c in FIGS. 2A to 7 may be manufactured using MSN having a functional group formed on the surface thereof.

The second filters 320 and 320a illustrated in FIGS. 2A to 4 may be manufactured by filling the tube structures 323 and 323a with MSN.

The second filters 320b and 320c illustrated in FIGS. 5 to 7 may be manufactured by forming the second layer L2 in which MSN is integrated on the first layer L1. In example embodiments, the second filters 320b and 320c may be manufactured by a casting method. For example, the first layer L1 of the porous support may be immersed in 2.0 wt % of an aqueous solution of m-phenylenediamine (MPD) for about 3 minutes. The excess aqueous solution on the surface of the first layer L1 may be removed by a roller. Thereafter, the first layer L1 may be immersed in a trimesoylchloride (TMC)-hexane solution including MSN for about 2 minutes. A weight of MSN may be from about 50 wt % to about 80 wt % based on a total weight of the solution. By the method described above, the second filter in which the second layer L2, which is a polyamide layer in which MSN is integrated, is stacked on the first layer L1, may be formed.

According to the aforementioned example embodiments, by filtering chemical materials flowing into the process chamber, contaminants included in the chemical material flowing into the semiconductor process may be removed, the flow of the chemical materials may not be impeded.

While the example embodiments have been illustrated and described above, it will be configured as apparent to those skilled in the art that modifications and variations could be made without departing from the scope of the present disclosure as defined by the appended claims.

What is claimed is:

1. A filter structure, comprising:
a housing having an inlet and an outlet;
a first filter in the housing and including a polymer membrane for filtering a first fluid flowing from the inlet into the housing; and
a second filter in the housing, filtering a second fluid filtered by the first filter, and including mesoporous silica nanoparticles (MSN),
wherein the second filter includes a tube having a non-linear flow path.

2. The filter structure of claim 1, wherein a third fluid filtered by the second filter is discharged through the outlet of the housing.

3. The filter structure of claim 1, wherein mesoporous silica nanoparticles included in the second filter have a particle size of about 50 nm to about 500 nm, and a pore size of about 5 nm to about 20 nm.

4. The filter structure of claim 1, wherein a surface area per unit weight of mesoporous silica nanoparticles included in the second filter is about 500 $m^2$/g to about 1400 $m^2$/g.

5. The filter structure of claim 1, wherein mesoporous silica nanoparticles included in the second filter include a functional group on a surface thereof.

6. The filter structure of claim 5, wherein the functional group includes one or more of a thiol group and an amine group.

7. The filter structure of claim 1, wherein the tube having a non-linear flow path is filled with the mesoporous silica nanoparticles.

8. The filter structure of claim 7, wherein a membrane or a syringe filter having a pore size smaller than a particle size of mesoporous silica nanoparticles is included on at least both ends of the tube having a non-linear flow path.

9. The filter structure of claim 1,
wherein the second filter includes a porous support and a thin film provided on the porous support, and
wherein the thin film includes mesoporous silica nanoparticles of about 50 wt % to about 80 wt % based on a total weight of the thin film.

10. The filter structure of claim 9, wherein the thin film is provided on both surfaces of the porous support.

11. The filter structure of claim 9, wherein a thickness of the thin film is about 200 nm to about 500 nm.

12. The filter structure of claim 9, wherein mesoporous silica nanoparticles included in the thin film have a particle size of about 50 nm to about 200 nm, and have a pore size of about 10 nm to about 20 nm.

13. The filter structure of claim 9,
wherein the porous support includes polysulfone, and
wherein the thin film includes polyamide.

14. A substrate treating system, comprising:
a process chamber performing a semiconductor process on a substrate;
a supply source supplying fluid to the process chamber; and
a filter structure disposed between the supply source and the process chamber,
wherein the filter structure includes:
a first filter primarily filtering a first fluid supplied from the supply source and including a polymer membrane; and a second filter secondarily filtering a second fluid filtered by the first filter and including mesoporous silica nanoparticles having a functional group on a surface thereof, wherein the second filter includes a tube having a non-linear flow path.

15. The substrate treating system of claim 14, wherein the second filter removes one or more of metals, organic molecules, chemical dyes and oils included in the second fluid.

16. The substrate treating system of claim 14, wherein mesoporous silica nanoparticles include one or more functional groups of a thiol group and an amine group on a surface thereof.

17. The substrate treating system of claim 14, wherein the first filter includes one or more of ultra-high-molecular-weight polyethylene (UPE), high-density polyethylene (HDPE), polytetrafluoroethylene (PTFE) and nylon.

18. A filter structure, comprising:

a first filter filtering fluid and including a polymer membrane; and a second filter filtering fluid passing through the first filter, wherein the second filter includes mesoporous silica nanoparticles having a particle size of about 50 nm to about 500 nm and a pore size of about 5 nm to about 20 nm and including one or more of functional groups of a thiol group and an amine group on a surface thereof, and wherein the second filter includes a tube having a non-linear flow path.

19. The filter structure of claim 18, wherein the first filter and the second filter are connected to each other in series.

20. The filter structure of claim 18, further comprising:

a third filter connected to the first filter in series and including mesoporous silica nanoparticles, wherein the first filter filters fluid filtered by the third filter.

* * * * *